United States Patent
Belanger, Jr. et al.

(10) Patent No.: US 6,752,637 B2
(45) Date of Patent: Jun. 22, 2004

(54) FLEXIBLE CIRCUIT RELAY

(75) Inventors: Thomas Dudley Belanger, Jr., Saline, MI (US); David John Rutkowski, Grosse Ile, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 360 days.

(21) Appl. No.: 09/777,982

(22) Filed: Feb. 6, 2001

(65) Prior Publication Data

US 2002/0106914 A1 Aug. 8, 2002

(51) Int. Cl.[7] .................. H01R 12/00; H01R 11/30; H01R 13/60; H05K 1/00
(52) U.S. Cl. ................... 439/74; 439/67; 439/38
(58) Field of Search ................. 439/67, 38, 74, 439/77, 493, 592, 597, 620; 200/512

(56) References Cited

U.S. PATENT DOCUMENTS

| | | | | |
|---|---|---|---|---|
| 4,093,883 A | | 6/1978 | Yamamoto | 310/317 |
| 4,403,166 A | | 9/1983 | Tanaka et al. | 310/332 |
| 4,445,732 A | * | 5/1984 | Wafer | 439/38 |
| 4,564,832 A | | 1/1986 | Inoue | 340/365 R |
| 4,918,513 A | * | 4/1990 | Kurose et al. | 257/693 |
| 5,121,091 A | | 6/1992 | Fujiyama | 335/1 |
| 5,156,553 A | * | 10/1992 | Katsumata et al. | 439/62 |
| 5,161,985 A | * | 11/1992 | Ramsey | 439/284 |
| 5,501,009 A | * | 3/1996 | McClure | 29/882 |
| 5,513,075 A | * | 4/1996 | Capper et al. | 361/773 |
| 5,726,861 A | * | 3/1998 | Ostrem | 174/260 |
| 5,727,956 A | * | 3/1998 | Mitra et al. | 439/74 |
| 5,921,787 A | * | 7/1999 | Pope et al. | 439/660 |

* cited by examiner

*Primary Examiner*—Chandrika Prasad

(57) ABSTRACT

An arrangement of a flex circuit (7) is provided which includes a first substrate (10) with a connected first conductive membrane (16) having a first gap (20). A second substrate (44) with a connected conductive membrane (50) is spaced away from the first substrate (10). At least one of the substrates (10), (44) is flexible. A first surface mounted device (24) with a first end cap termination (36), bridges over the first gap (20). The end cap termination (36) electrically connects with the second conductive membrane (50) to complete an electrical circuit between the first and second conductive membranes (16), (50) when the substrates (10), (44) are displaced toward one another.

36 Claims, 2 Drawing Sheets

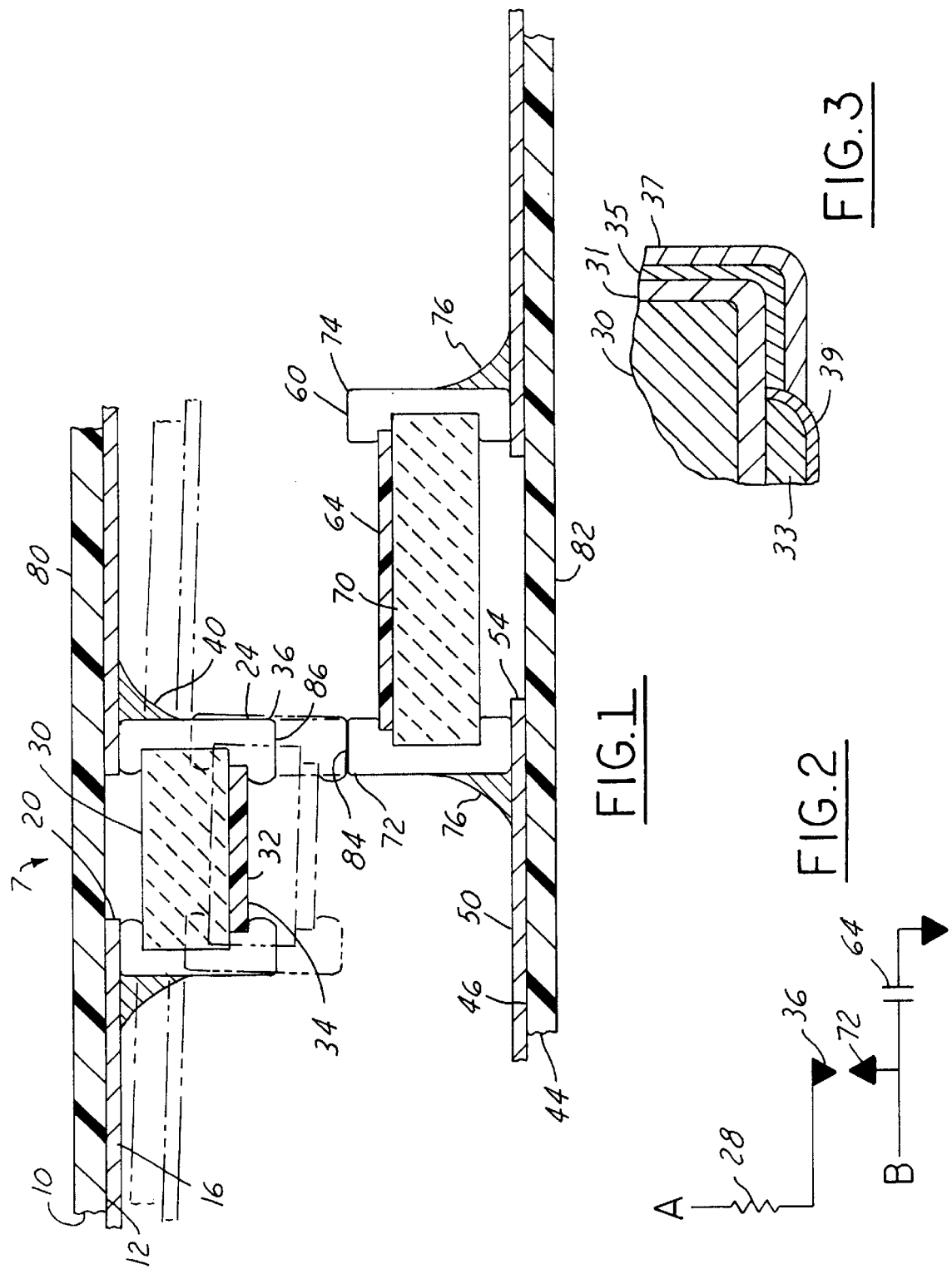

FLEXIBLE CIRCUIT RELAY

FIELD OF THE INVENTION

The field of the present invention is that of flexible circuits. More particularly the field of the present invention is that of flexible circuits utilized in the automotive industry which can additionally incorporate the terminals of surface mounted devices as contacts for various electrical components.

BACKGROUND OF THE INVENTION

In the most recent quarter century there has been a significant increase in the utilization of electronics in automotive vehicles. For example virtually all automotive vehicles are now controlled by an engine control module to optimize the performance of the engine with regard to fuel efficiency and environmental emissions. Inflatable restraints have been added to enhance occupant safety in an event of a crash situation. Advanced braking systems have been provided such as in anti-skid braking and traction control to further enhance safe operation of the vehicle occupants. Other electrical systems have been added or enhanced to add to the comfort of the vehicle. The above mentioned additions and enhancements have added to the complexity of the wiring system which supplies power and signal transfer to and from various electrical components and controllers. Currently most power requirements and signaling requirements in a vehicle are supplied by hard conductor wiring. The required wiring is provided in a bundle which is commonly called a wiring harness. Fabrication of a wiring harness is a very labor intensive operation. Additionally installation and/or repair of a wiring harness can also be very time consuming and expensive. Another disadvantage associated with the hard copper conductive wiring currently provided in most vehicles is in the cost associated with the copper. For certain applications the copper wire needed to provide for signal transfer at a low electrical load can be provided by a copper wire of a very small cross-sectional area. However, a minimum diameter of copper wiring is not determined not by its electrical requirements. The minimum diameter of the wiring is determined by its frailty during the assembly process of the wiring harness and of the wiring of the vehicle.

In an attempt to reduce the cost of automotive wiring harnesses a new type of electrical conduit has been provided. This new conduit is typically referred to as a flexible circuit. In a flexible circuit a polymeric (or insulated metallic ribbon) substrate which is flexible provides support for the various electrical conductor lines. The electrical conductors needed are then supplied by a foil which is affixed to the flexible substrate. Another flexible layer of polymeric material can cover the conductors on the flexible substrate.

The utilization of flexible circuits as a replacement for the prior wiring harnesses has been limited due to the particular problems faced by flexible circuits at the various component interfaces. For instance, the interface of the flexible circuit with a fuse box has been a particular limiting factor. To overcome those limitations an inventive contact method has been provided as explained in U.S. patent application Ser. No. 09/298,240 filed Apr. 22, 1999. Other examples of connector interfaces for flexible circuits can be found in a review of U.S. Pat. Nos. 5,885,091 and 5,969,418, commonly assigned.

Another problem which comes about with the utilization of flexible circuits is in the use of relays. Relays are typically switches that have two contacts which are either spring biased towards or away from each other, which are activated (closed or opened) by an electromagnetic force by a selectively excitable electromagnetic coil. Relays are typically provided for high current applications which require momentary application. Relays are commonly self-contained entities that contain a coil and contacts. Relays are typically pre-packaged to a pre-determined physical footprint. The design of relays is mostly controlled by their manufacturers and users of such relays adapt their circuits to pre-designed physical specifications. Two major elements in the design of relays is the generation of high current contact heat between the contacts, and the amount of current which is allowed in the exciting coil which is typically of a much lower current. Because of the current capabilities of the contacts of the relay, most relays have a solid post with a relatively high mass. The relay coil is typically specified to be excited by a low current and therefore has very low mass copper wires. When connecting the relay to a conventional circuit board the high relative mass of the relay terminals provide a relatively large heat sink so that lots of heat is required to assemble the relay to the remainder of the circuit. This heat required for assembly is typically within the limits of a rigid circuit board. However, with a flexible circuit no such rigid circuit board is provided and items such as relays which require a high heat input are difficult to assemble to the flexible circuit. An attempt to provide the heat required for many relays will cause the flexible circuit to be warped and deformed. Prior to the present invention to accommodate the heat of assembly the flexible circuit would often have to be redesigned to be a non-planar structure with a much larger mass then what was desirable. Such a modification of the flexible circuit diminishes its many advantages. Flexibility of the flexible circuit is especially important in applications of engine control modules which often have physically large circuits which are folded over for placement within a mounting box to conserve space within the engine compartment of the vehicle. It is desirable to provide freedom of utilization of a flexible circuit which allows for the relatively higher current contacts in connecting one circuit to another that is typically required in the utilization of a relay without having a flexible circuit with an increased mass which will diminish its characteristics of flexibility.

SUMMARY OF THE INVENTION

To make manifest the above noted and other desires a revelation of the present invention is brought forth. In a preferred embodiment circuit arrangement of the present invention, the contact members of the relay are separated from the coil mechanism. The contact members are brought into contact by displacement of two flexible substrates which are normally separated from each other. The contacts of the substrates can be one of the circuit conductive traces with an end cap of a surface mounted device on the other substrate. The device which brings the separated substrates in the contact with each other can be an aforementioned coil or can be due to physical displacement such as in a keyboard. With the utilization of surface mounted devices which are already utilized on the flexible circuits the end caps of the surface mounted devices can be utilized as the contacts. The present invention is even more particularly advantageous since most end caps are made from a silver alloy conductive material which provides a low interface resistance. When used in the embodiment of a relay, the flexible circuit arrangement of the present invention can have a coil that can be post connected with one of the substrates on a ferritic carrier. The coil need not be exposed to the heat of assembly of the surface mounted devices.

Other features of the invention will become more apparent to those skilled in the art upon a reading of the following detailed description and upon reference to the drawings.

BRIEF DESCRIPTION OF THE DRAWINGS

FIG. 1 is an enlarged side elevational view of a flex circuit arrangement according to the present invention.

FIG. 2 is an electrical diagram of the circuit shown in FIG. 1.

FIG. 3 is an enlargement of an end cap of a surface mounted device with an alternate termination to that shown in FIG. 1.

DETAILED DESCRIPTION OF THE INVENTION

Figure 4:
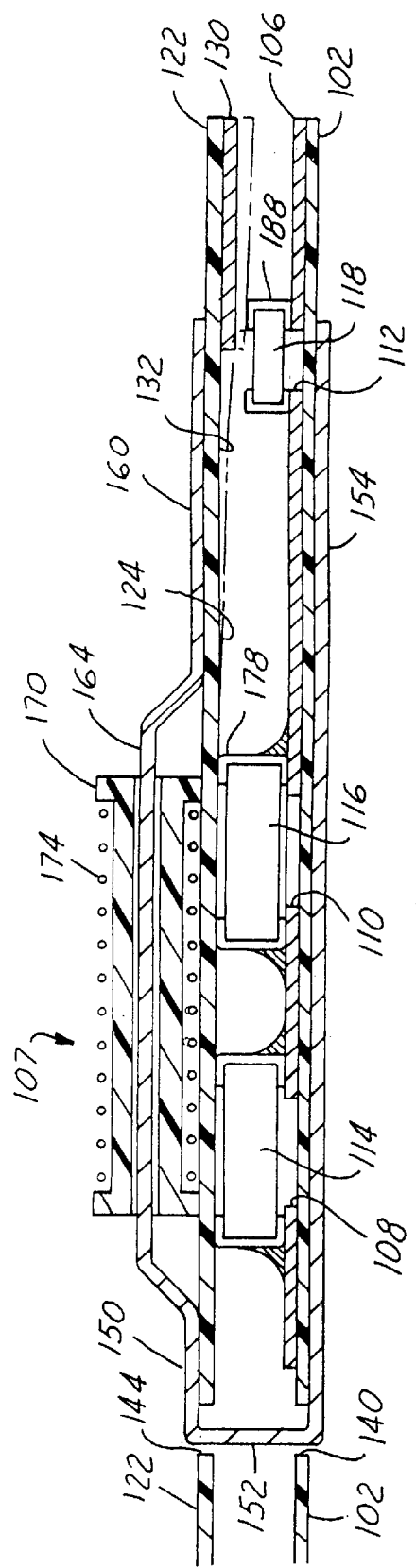
FIG. 4 is a sectional view of a flex circuit relay arrangement according to the present invention.
Figure 5:
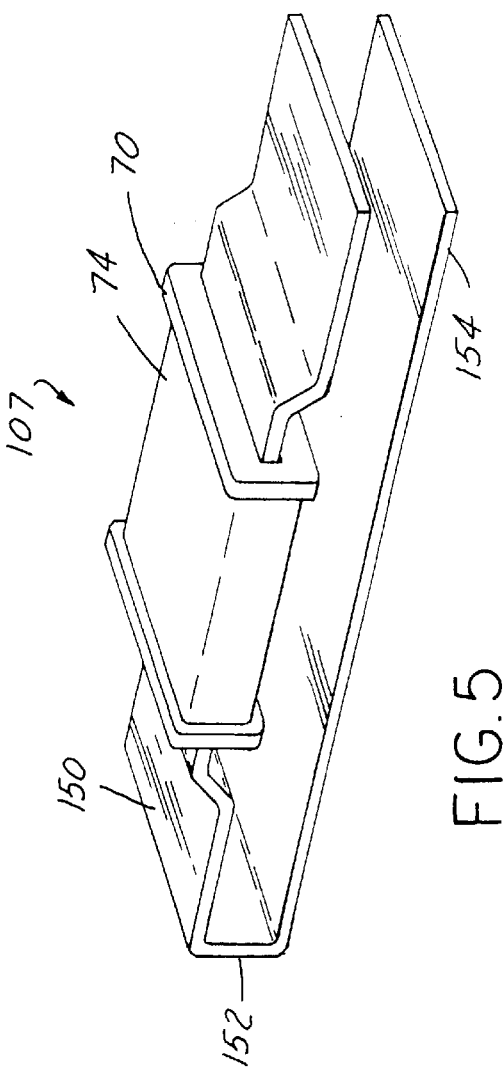
FIG. 5 is a perspective view of a ferritic insert and relay coil which is shown in the flex circuit relay arrangement of FIG. 4.

Referring to FIGS. 1 and 2, an arrangement of a flex circuit 7 of the present invention is provided. The flex circuit 7 includes a first generally polymeric substrate 10. The first substrate 10 is approximately 0.75 mm thick and preferred values have been found between 0.25 and 1.5 mm. Although the 0.25 and 1.5 mm. range of thicknesses has been found to be preferable, the present invention can be utilized on substrates which are lower or greater than the aforementioned preferred thickness range. A preferred material for the first substrate 10 is polyimide. Polyimide is often preferable wherein soldering may be utilized to attach electrical devices to the substrate. Where a conductive adhesive is utilized to connect electrical devices to the substrate in lieu of soldering, polyester has been found to be suitable. The substrate can also include other material such as PVDF and Teflon. Furthermore, the substrate can be a metal ribbon which is insulated. The insulation may be provided by a post-lamination process, or by use of an adhesive which is used to bond a conductor to the substrate. If a metal ribbon substrate is provided, it can be utilized as part of an electrical circuit as a ground plane.

Adhesively connected with the first substrate 10 along its surface 12 is a first conductive membrane 16. The first conductive membrane typically can be a foil or powder copper which has been etched out in a circuit desired pattern. Other conductive membrane materials will include aluminum or an un-solderable material such as aluminum or an aluminum alloy which is cladded over copper. The copper allows an electrical component to be attached to the connective membrane by solder, although aluminum is being relied upon to perform the conductive function. The first conductive membrane 16 has a gap 20 therein. The gap serves to prevent shorts between the termination points of electrical components.

Mounted over the first gap 20 is a first surface mounted device 24. The first surface mounted device 24 provides a thick film resistor 28. The surface mounted device 24, as shown, is a flat chip resistor. However, other suitable surface mounted devices can also be utilized such as capacitors, inductors, fuses, shunts and other various electrical elements. The surface mounted device 24 has an alumina substrate 30. Extending on top of the alumina substrate 30 is a film resistive element 32. A typical resistive film material is Ruthenium Oxide $RuO_2$. The resistive element 32 additionally has a protective coating on its side 34 which is not shown. The surface mounted device 24 has two outer post terminals or end caps 36. There are two ways to fabricate the end cap of the chip resistor surface mounted device 32. In FIG. 3 the end cap construction illustrates a pre-termination of the conductor 31. The conductor 31, sometimes referred to as inner termination, is applied first, then the resistor material 33 is applied. In the FIG. 1 the end cap conductor is post terminated, being applied after the resistor 32 is applied to the substrate 30. A 0.0003 mm thick termination barrier 35, extends over the inner termination 31 and is typically provided by nickel (shown in FIG. 3 only). The barrier 35 termination is provided for leaching control. The barrier termination 35 is covered by a 0.0003 mm thick outer termination 37 (shown in FIG. 3 only). The outer termination is typically provided by a precious metal silver or silver palladium alloy. The palladium is typically added to prevent the leaching of the silver from the outer terminal during a subsequent soldering attaching operation. The end caps can vary in height, typical values are 0.35 to 0.6 mm. The first surface device will typically have a $\frac{1}{16}$ to 1.0 watt power rating with a 0.1 to 22 Kohms resistance range. The first surface mounted device 24 is attached with the first conductive membrane 16 by solder 40.

Spaced generally parallel away from the first substrate 10 is a second flexible generally non-conductive substrate 44. The second substrate 44 can be generally similar or identical to the first substrate 10 and in certain applications may be formed on one and the same sheet of substrate and then be folded to the position as shown in FIG. 1. Additionally, the first and second substrates can be held in position by a frame or housing, not shown. Connected on a surface 46 of the second substrate 44 is a second conductive membrane 50. The second conductive membrane 50 has a gap 54. Bridging the gap 54 is a surface mounted device 60. The surface mounted device 60 provides a thick film capacitor. The thick film capacitor 64 is supported on an alumina base 70. In a similar manner, afore-described in regards to the first surface mounted device 24, the surface mounted device 60 has end caps 72 and 74. End caps 72 and 74 are connected with the second substrate 50 by solderings 76.

The end caps provide contacts for the circuit shown in FIG. 2. The substrates 10, 44 can be displaced with respect to one another by mechanical contact with surfaces 80 or 82 or by utilization of an electromotive force which acts upon ferritic members positioned adjacent to the first and second substrates 10 and 44. Upon displacement of the substrates 10, 44 the end caps 36 and 72 are allowed to make contact with one another to complete the circuit. It is apparent to those skilled in the art that alternatively, one of the substrates can be rigid allowing the opposite substrate to be flexible allowing its respective surface mounted device to be pushed towards the opposite surface mounted device. A significant advantage of the flexible circuit arrangement 7 is that the spaced-apart positions of the substrates 10 and 44 for one another can be restored by the natural rigidity of the polymeric substrates 10, 44. Additionally, the end cap surfaces 86 and 84 can make adequate electrical contact without perfect alignment with one another. Still another advantage of the present invention is that the contacts 36 and 72 provided by the end caps takes advantage of the fact that the end caps are typically coated with silver or a silver palladium alloy or other precious metals which already provide low contact resistance without a special preparation as required in other electrical device contacting members.

Referring to FIG. 4, a flex circuit relay 107, according to the present invention is provided. The relay 107 includes a first substrate 102. The properties of the substrate 102 are as those previously described in regards to substrate 10. The substrate 102 has connected thereon a first conductive membrane 106. Conductive membrane 106 has properties essentially the same as those of previously mentioned conductive membrane 16. Conductive membrane 106 has three gaps 108, 110 and 112 respectively. Merging over the gaps 108, 110 and 112 are surface mounted devices 114, 116 and 118. Surface mounted devices 114 and 116 are both larger in the height dimension then surface mounted device 118. Spaced from the first substrate 102 is a second polyester flexible substrate 122. The substrate 122 has connected thereto on a side 124 facing the first substrate 102, a conductive membrane 130. The conductive membrane 130 has a gap 132.

The substrate 102 has a slot 140. The substrate 122 has a corresponding generally aligned slot 144. Inserted within the slots 144 and 142 is a ferritic member 150. The ferritic member 150 is shaped generally as a hair pin having a closed end 152 with a first extending arm 154 and a second extending arm 160. The second arm 160 has a laterally bent portion 164 which is encircled by a spool 170. The spool 170 is encircled by coil windings 174. The coil windings 174 can be selectively energized by a power source (not shown). The substrate 122 is supported away from the first substrate by the end caps 178 and 180 of the surface mounted devices 116 and 114. Excitation of the coils 174 causes an electromagnetic field to be generated within the ferritic member 150 causing the arms 160 and 154 to seek to close together to complete the electromagnetic field causing the second conductive member 130 to come into contact with an end cap 188 of the first surface mounted device to complete an electric circuit. Accordingly, the arrangement 107 provides a flexible circuit relay. A significant advantage of a flexible circuit relay 107 is that the relay ferritic member and coil windings 174 can be added to the circuit subsequent to the soldering of the surface mounted devices 114, 116 and 118 to the first conductive membrane 106. Therefore, the windings 174 can be made as small as possible and are not exposed to the heat in the soldering operation. Additionally, separate contacts need not be made and the electric connection can be made directly between the conductive membrane 130 and the end cap 188.

While the invention has been described in connection with a preferred embodiments, it will be understood that it is not intended to limit the invention to those particular embodiments. On the contrary it is endeavored to cover all alternatives, modifications and equivalent as may be included within the spirit and scope of the invention as encompassed by the description and as defined by the appended claims.

We claim:

1. An arrangement of a flex circuit comprising:
   a first substrate;
   a first conductive membrane connected with said first substrate, said first membrane having a first gap;
   a second substrate spaced away from said first substrate, at least one of said first or second substrates being flexible;
   a second conductive membrane connected with said second substrate; and
   a first surface mounted substrate-based electrical device with an end cap termination, said first surface mounted device bridging over said first gap in said first conductive membrane, said end cap termination electrically connecting with said second conductive membrane to complete an electrical circuit between said first and second conductive membranes when said substrates are displaced toward one another.

2. An arrangement of a flex circuit as described in claim 1, wherein said first substrate is a flexible substrate.

3. An arrangement of a flex circuit as described in claim 1, wherein said second substrate material is a flexible substrate.

4. An arrangement of a flex circuit as described in claim 1, wherein said first and second substrate material are flexible substrates.

5. An arrangement of a flex circuit as described in claim 1, wherein said flexible substrate material is a polymeric material.

6. An arrangement of a flex circuit as described in claim 5, wherein said substrate material is a polyimide.

7. An arrangement of a flex circuit as described in claim 5, wherein said flexible substrate material is polyester.

8. An arrangement of a flex circuit as described in claim 1, wherein said flexible substrate material is a metal ribbon.

9. An arrangement of a flex circuit as described in claim 1, wherein said flexible substrate has a thickness between 0.25 and 1.5 mm.

10. An arrangement of a flex circuit as described in claim 1, wherein one of said conductive membranes material is copper.

11. An arrangement of a flex circuit as described in claim 1, wherein one of said conductive membranes material is aluminum.

12. An arrangement of a flex circuit as described in claim 1, wherein said first conductive membranes material is an un-solderable metal cladded to a solderable material.

13. An arrangement of a flex circuit as described in claim 1, wherein said end cap termination is a post terminal end cap termination.

14. An arrangement of a flex circuit as described in claim 1, wherein said end cap termination is a pre-terminal end cap termination.

15. An arrangement of a flex circuit as described in claim 1, wherein said end cap termination material is a precious metal.

16. An arrangement of a flex circuit as described in claim 15, wherein said end cap termination material is silver.

17. An arrangement of a flex circuit as described in claim 1, wherein said end cap termination material is a silver alloy.

18. An arrangement of a flex circuit as described in claim 1, wherein said end cap termination material is made from a metal which includes tin.

19. An arrangement of a flex circuit as described in claim 1, wherein said second conductive membrane has a second surface mounted device bridging over a gap in said second conductive membrane and said second surface device has an end cap termination for making contact with said first surface device end cap termination to allow said first and second conductive membranes to make electrical contact.

20. An arrangement of a flex circuit as described in claim 1, wherein said first and second substrates are displaced toward one another by a magnetic force.

21. An arrangement of a flex circuit as described in claim 1, wherein said first and second substrates are displaced towards one another by an object mechanical contacting of one of said flexible substrates.

22. An arrangement of a flex circuit comprising:
   a first generally flexible polymeric substrate;
   a first conductive membrane connected with said first substrate, said first membrane having a first gap;
   a second polyimide flexible substrate spaced away from said first substrate;

a second conductive membrane connective with said second substrate having a first gap;

a first surface mounted substrate-based electrical device with an end cap termination, said first surface mounted device bridging over said first gap in said first conductive membrane; and a second surface mounted device with an end cap termination, said second surface mounted device bridging over said first gap in said second conductive membrane, said end cap terminations of said first and second surface mounted devices electrically connecting said first and second conductive membranes to complete an electrical circuit when said first and second substrates are displaced toward one another.

23. An arrangement of a flex circuit relay comprising:

a first substrate;

a first conductive membrane connected with said first substrate, said first conductive membrane having at least first and second gaps;

first and second surface mounting devices, said first surface mounted device being larger than said second surface mounted device in at least a first dimension and said second surface mounted device being a substrate-based electrical device having an end cap termination;

a second substrate, at least one of said first or second substrates being flexible;

a second conductive member connected with said second substrate, said second conductive membrane having at least a first gap;

a ferritic member having first and second extending arms, said first arm supporting said first and second surface mounted devices on said first flexible substrate with said second surface mounted device adjacent an open end of said ferritic member; and a coil encircling said ferritic member for exciting a magnetic field therein to cause said first and second arms to be displaced with respect to one another causing said second conductive membrane to come into contact with an end cap termination of said second surface mounted device to form an electrical circuit between said second conductive membrane and said first conductive membrane.

24. An arrangement of a flex circuit relay as described in claim 23, wherein said flexible substrate is a polymeric material.

25. An arrangement of a flex circuit relay as described in claim 23, wherein said flexible substrate is a polyimide material.

26. An arrangement of a flex circuit relay as described in claim 23, wherein said flexible substrate is a metal ribbon.

27. An arrangement of a flex circuit relay as described in claim 23, wherein said flexible substrate has a thickness between 0.25 and 1.5 mm.

28. An arrangement of a flex circuit relay as described in claim 23, wherein said conductive membrane material connected with said flexible substrate is copper.

29. An arrangement of a flex circuit relay as described in claim 23, wherein said conductive membrane material connected with said flexible substrate is aluminum.

30. An arrangement of a flex circuit relay as described in claim 23, wherein said conductive membrane material is an un-solderable metal cladded to a solderable material.

31. An arrangement of a flex circuit relay as described in claim 23, wherein said coil encircles said ferritic member about said second arm.

32. An arrangement of a flex circuit relay as described in claim 23, wherein said first surface mounted device supports said second substrate away from said first surface mounted device.

33. An arrangement of a flex circuit relay as described in claim 23, wherein said ferrite member is threaded into two slots of said first and second substrates.

34. An arrangement of a flex circuit comprising:

a first substrate;

a first conductive membrane connected with said first substrate, said first membrane having a first gap;

a second substrate spaced away from said first substrate, at least one of said first or second substrates being flexible;

a second conductive membrane connected with said second substrate; and a surface mounted flat chip resistor with an end cap termination, said flat chip resistor bridging over said first gap in said first conductive membrane, said end cap termination electrically connecting with said second conductive membrane to complete an electrical circuit between said first and second conductive membranes when said substrates are displaced toward one another.

35. An arrangement of a flex circuit comprising:

a first substrate;

a first conductive membrane connected with said first substrate, said first membrane having a first gap;

a second substrate spaced away from said first substrate, at least one of said first or second substrates being flexible;

a second conductive membrane connected with said second substrate; and a surface mounted film electrical element with an end cap termination, said film electrical element bridging over said first gap in said first conductive membrane, said end cap termination electrically connecting with said second conductive membrane to complete an electrical circuit between said first and second conductive membranes when said substrates are displaced toward one another.

36. An arrangement of a flex circuit comprising:

a first substrate;

a first conductive membrane connected with said first substrate, said first membrane having a first gap;

a second substrate spaced away from said first substrate, at least one of said first or second substrates being flexible;

a second conductive membrane connected with said second substrate; and a surface mounted film capacitor with an end cap termination, said film capacitor bridging over said first gap in said first conductive membrane, said end cap termination electrically connecting with said second conductive membrane to complete an electrical circuit between said first and second conductive membranes when said substrates are displaced toward one another.

* * * * *